(12) United States Patent
Estrada

(10) Patent No.: US 12,111,570 B2
(45) Date of Patent: Oct. 8, 2024

(54) SHAPING SYSTEM WITH CUTOUTS IN AN OPTICAL DIAPHRAGM AND METHOD OF USE

(71) Applicant: CANON KABUSHIKI KAISHA, Tokyo (JP)

(72) Inventor: Teresa Perez Estrada, Pflugerville, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 685 days.

(21) Appl. No.: 17/215,630

(22) Filed: Mar. 29, 2021

(65) Prior Publication Data

US 2022/0308445 A1 Sep. 29, 2022

(51) Int. Cl.
| | |
|---|---|
| *G03F 7/00* | (2006.01) |
| *B29C 35/08* | (2006.01) |
| *B29C 59/02* | (2006.01) |
| *B82Y 40/00* | (2011.01) |

(52) U.S. Cl.
CPC ........ *G03F 7/0002* (2013.01); *B29C 35/0805* (2013.01); *B29C 59/022* (2013.01); *B29C 2035/0827* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,480,946 B2 | 7/2013 | Mikami et al. | |
| 2009/0224436 A1* | 9/2009 | Mikami | B82Y 40/00 |
| | | | 264/447 |
| 2010/0096764 A1 | 4/2010 | Lu | |
| 2011/0154271 A1* | 6/2011 | Agarwal | G03F 1/36 |
| | | | 716/50 |
| 2019/0101823 A1 | 4/2019 | Patel et al. | |
| 2019/0179228 A1 | 6/2019 | Khusnatdinov et al. | |
| 2020/0223126 A1 | 7/2020 | Hayashi et al. | |

FOREIGN PATENT DOCUMENTS

| | | |
|---|---|---|
| JP | 5392145 B2 | 1/2014 |
| JP | 2014-195088 A | 10/2014 |

* cited by examiner

*Primary Examiner* — Matthew J Daniels
(74) *Attorney, Agent, or Firm* — Daniel Ratoff

(57) ABSTRACT

A shaping system and method of using the shaping system. The shaping system may comprise a radiation source; a template chuck configured to hold a template; and an optical diaphragm positioned between the template chuck and the radiation source. The optical diaphragm may have a plurality of blades. Each blade has a cutout in an edge of each blade. Edges and cutouts of the plurality of blades may form an opening which actinic radiation from the radiation source passes through.

13 Claims, 11 Drawing Sheets

SHAPING SYSTEM WITH CUTOUTS IN AN OPTICAL DIAPHRAGM AND METHOD OF USE

BACKGROUND OF INVENTION

Technical Field

The present disclosure relates to photomechanical shaping systems (e.g., Nanoimprint Lithography and Inkjet Adaptive Planarization) with a novel form of a projection system aperture and methods of using the photomechanical shaping systems with the novel form of a projection system aperture.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid that may have been deposited as a drop pattern causing the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a shaping system. The shaping system may comprise a radiation source; a template chuck configured to hold a template; and an optical diaphragm positioned between the template chuck and the radiation source. The optical diaphragm may have a plurality of blades. Each blade has a cutout in an edge of each blade. Edges and cutouts of the plurality of blades may form an opening which actinic radiation from the radiation source passes through.

In an aspect of the first embodiment the cutouts may be arranged to increase intensity, at an image plane, of actinic radiation from the radiation source at corners of a mesa of the template, relative to blades without cutouts.

In an aspect of the first embodiment the cutouts may be arranged to reduce a variation in actinic radiation received at corners of a mesa of the template relative to the actinic radiation received at centers of mesa edges to be below a variation threshold.

In an aspect of the first embodiment the cutouts may curve outwards towards intersections of the blades.

In an aspect of the first embodiment the plurality of blades may be movable to a first position at which a first particular cutout in a first particular blade intersects with a second particular cutout in a second particular blade.

In an aspect of the first embodiment one or more of the cutouts may have a rectilinear shape.

In an aspect of the first embodiment the plurality of blades may include a first blade and a second blade which intersect to form a first corner of the optical diaphragm. The first blade may include a first cutout that is a first distance from the first corner. The second blade may include a second cutout that is the first distance from the first corner.

In an aspect of the first embodiment the first distance may be less than a width of the cutouts.

In an aspect of the first embodiment the first cutout may intersect with the second cutout.

In an aspect of the first embodiment each blade may have two cutouts with a cutout width that are separated from each other by a cutout separation distance. A cutout fraction is a cutout width divided by cutout separation distance. The cutout fraction may be between 0.1-0.2.

In an aspect of the first embodiment the cutouts may be arranged to reduce a range in actinic radiation received at mesa edges of the template to be below a range threshold.

The first embodiment, may further comprise a substrate chuck configured to hold a substrate; and a positioning system configured to bring a mesa of the template into contact with formable material on the substrate. The radiation source exposes the formable material to actinic radiation that has passed through the opening formed by the optical diaphragm.

A second embodiment, may be a method of shaping a film with a shaping system. The method may also comprise bringing a template into contact with formable material on a substrate. The method may also comprise exposing the formable material to actinic radiation from a radiation source that has passed through an opening formed by an optical diaphragm. The method may also comprise separating the template from the formable material. The optical diaphragm may have a plurality of blades. Each blade may have a cutout in an edge of the each blade. Edges and cutouts of the plurality of blades may form the opening.

The second embodiment, may be a method of manufacturing an article using the method of shaping a film. The method of manufacturing the article may further comprise: shaping a device-yielding film on a device-yielding substrate using the method of shaping the film; processing the device-yielding substrate; and forming the article from the processed device-yielding substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
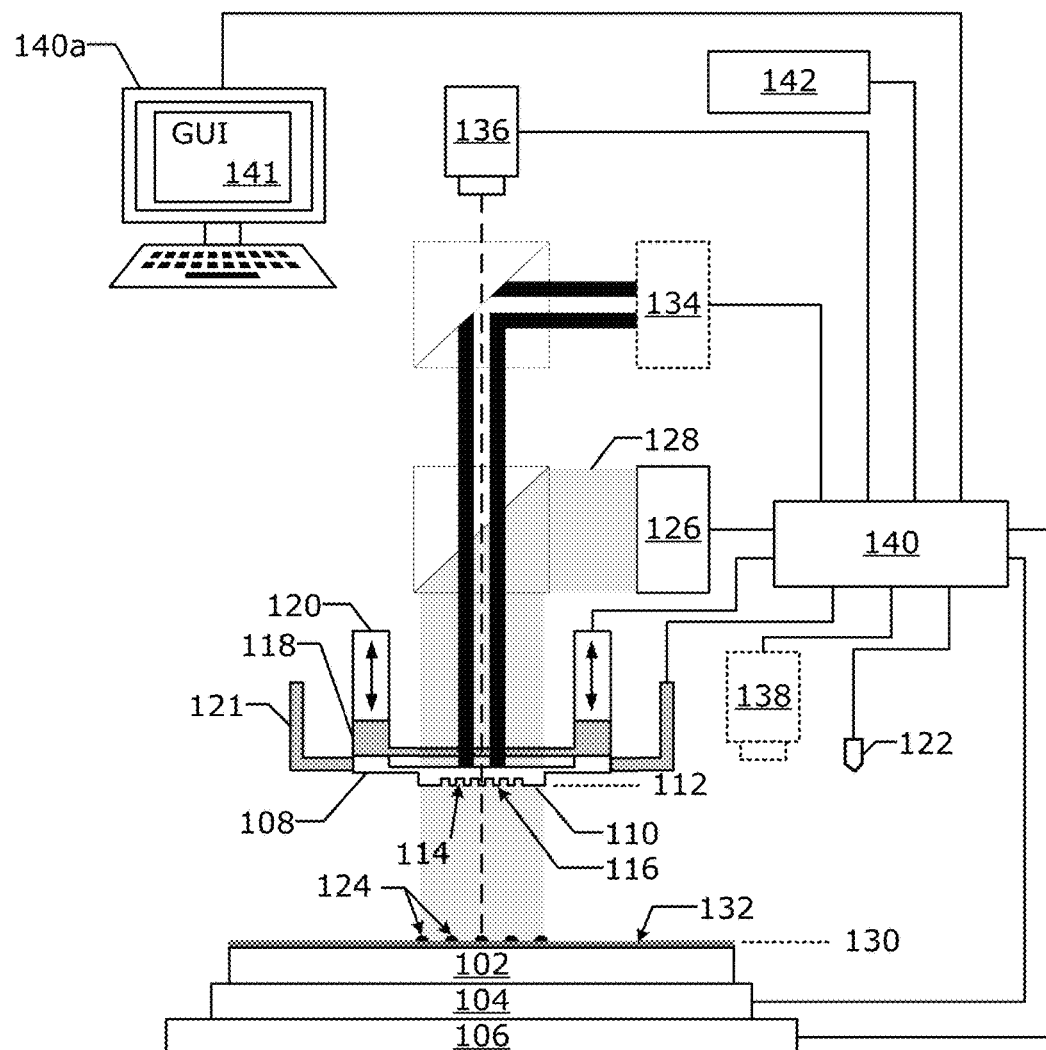
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprint lithography technique can be used to shape a film on a substrate from a formable material. The shaping process may be performed by contacting formable material on an imprint field of a substrate with a mesa. The mesa may have features used for patterning the formable material. The imprint field may match the shape of the mesa. After the mesa has contacted the formable material, the formable material under the mesa is exposed to actinic radiation which causes the formable material to cure (e.g., solidify, crosslink). The actinic radiation is supplied by a radiation source and guided by an optical system through the template to the formable material on the imprint field. The optical system includes an optical diaphragm that the controls the intensity and spatial distribution of the actinic radiation by controlling the size and a shape of an aperture through which actinic radiation passes through. The applicant has found that it is useful to carefully control the dosage of actinic radiation along the mesa edges and corners. By controlling the dosage of actinic radiation along the mesa edges and corners the occurrence of non-fill defects and extrusion defects can be reduced.

Shaping System

FIG. 1 is an illustration of a shaping system 100 (for example a nanoimprint lithography system or inkjet adaptive planarization system) in which an embodiment may be implemented. The shaping system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the positional axes x, y, and z, and rotational axes θ, ψ, and φ. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a template 108 (also referred to as a superstrate). The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a patterning surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mesa 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include a template magnification control system 121. The template magnification control system 121 may include piezoelectric actuators (or other actuators) which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to a shaping head 120 which is a part of the positioning system. The shaping head 120 may be moveably coupled to a bridge. The shaping head 120 may include one or more actuators such as voice coil motors, piezoelectric motors, linear motor, nut and screw motor, etc., which are configured to move the template chuck 118 relative to the substrate in at least the z-axis direction, and potentially other directions (e.g., positional axes x, and y, and rotational axes θ, ψ, and φ).

The shaping system 100 may further comprise a fluid dispenser 122. The fluid dispenser 122 may also be moveably coupled to the bridge. In an embodiment, the fluid dispenser 122 and the shaping head 120 share one or more or all of the positioning components. In an alternative embodiment, the fluid dispenser 122 and the shaping head 120 move independently from each other. The fluid dispenser 122 may be used to deposit liquid formable material 124 (e.g., polymerizable material) onto the substrate 102 in a drop pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the shaping surface 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The shaping system 100 may further comprise a curing system that induces a phase change in the liquid formable material into a solid material whose top surface is determined by the shape of the shaping surface 112. The curing system may include at least a radiation source 126 that directs actinic energy along an exposure path 128. The shaping head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. In an embodiment, the actinic energy may be directed through both the template chuck 118 and the template 108 into the formable material 124 under the template 108. In an embodiment, the actinic energy produced by the radiation source 126 is UV light that induces polymerization of monomers in the formable material 124.

The shaping system 100 may further comprise a field camera 136 that is positioned to view the spread of formable material 124 after the template 108 has contacted the formable material 124. FIG. 1 illustrates an optical axis of the field camera's imaging field as a dashed line. As illustrated in FIG. 1 the shaping system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of: a CCD; a sensor array; a line camera; and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting (shaping) process. The field camera 136 may also be configured to measure interference fringes, which change as the formable material spreads 124 between the gap between the shaping surface 112 and the substrate surface 130.

The shaping system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, optical diaphragms, apertures, filters, prisms, polarizers, windows, adaptive optics, and/or light sources. The droplet inspection system 138 may be positioned to inspect droplets prior to the shaping surface 112 contacting the formable material 124 on the substrate 102. In an alternative embodiment, the field camera 136 may be configured as a droplet inspection system 138 and used prior to the shaping surface 112 contacting the formable material 124.

The shaping system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a SLM such as a digital micromirror device (DMD), Liquid Crystal on Silicon (LCoS), Liquid Crystal Device (LCD), etc., to modulate the spatio-temporal distribution of thermal radiation. The shaping system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, drop dispense, slot dispense, etc. In an embodiment, the substrate 102 may be a semiconductor wafer. In another embodiment, the substrate 102 may be a blank template (replica blank) that may be used to create a daughter template after being imprinted.

The shaping system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The shaping system 100 may be regulated, controlled, and/or directed by one or more processors 140 (controller) in communication with one or more components and/or subsystems such as the substrate chuck 104, the substrate positioning stage 106, the template chuck 118, the shaping head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 140 may include a plurality of processors that are both included in the shaping system 100*a* and in communication with the shaping system 100*a*. The processor 140 may be in communication with a networked computer 140*a* on which analysis is performed and control files such as a drop pattern are generated. In an embodiment, there are one or more graphical user interface (GUI) 141 on one or both of the networked computer 140*a* and a display in communication with the processor 140 which are presented to an operator and/or user.

Either the shaping head 120, the substrate positioning stage 106, or both varies a distance between the mold 110 and the substrate 102 to define a desired space (a bounded physical extent in three dimensions) that is filled with the formable material 124. For example, the shaping head 120 may apply a force to the template 108 such that mold 110 is in contact with the formable material 124. After the desired volume is filled with the formable material 124, the radiation source 126 produces actinic radiation (e.g., UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the shaping system 100 uses a shaping process to form the patterned layer which has recesses and protrusions which are an inverse of the pattern in the shaping surface 112. In an alternative embodiment, the shaping system 100 uses a shaping process to form a planar layer with a featureless shaping surface 112.

The shaping process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the shaping surface 112 in each imprint field. The patterned layer may also include one or more features such as protrusions which extend above the residual layer having a thickness. These protrusions match the recesses 114 in the mesa 110.

Template

Figure 2:
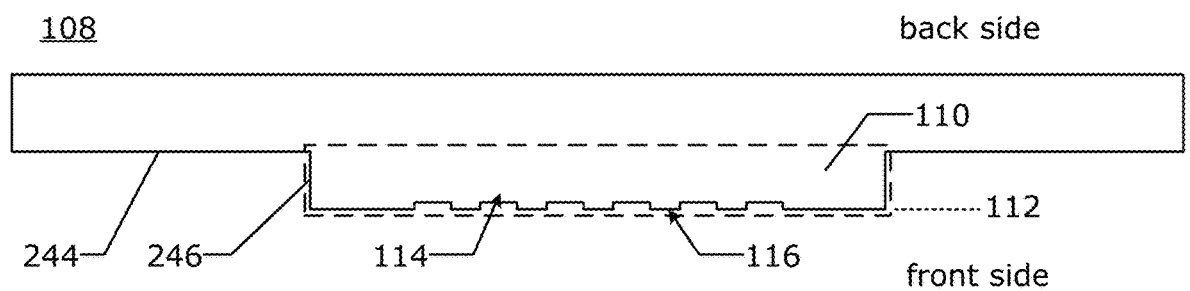
FIG. 2 is a side view illustration of an exemplary template that may be used in an embodiment.

FIG. 2 is an illustration of a template 108 (not to scale) that may be used in an embodiment. The shaping surface 112 may be on a mesa 110 (identified by the dashed box in FIG. 2). The mesa 110 is surrounded by a recessed surface 244 on the front side of the template. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners. In an embodiment, the mesa sidewalls 246 may have one or more of a perpendicular profile; an angled profile; a curved profile; a staircase profile; a sigmoid profile; a convex profile; or a profile that is combination of those profiles.

Shaping Process

Figure 3:
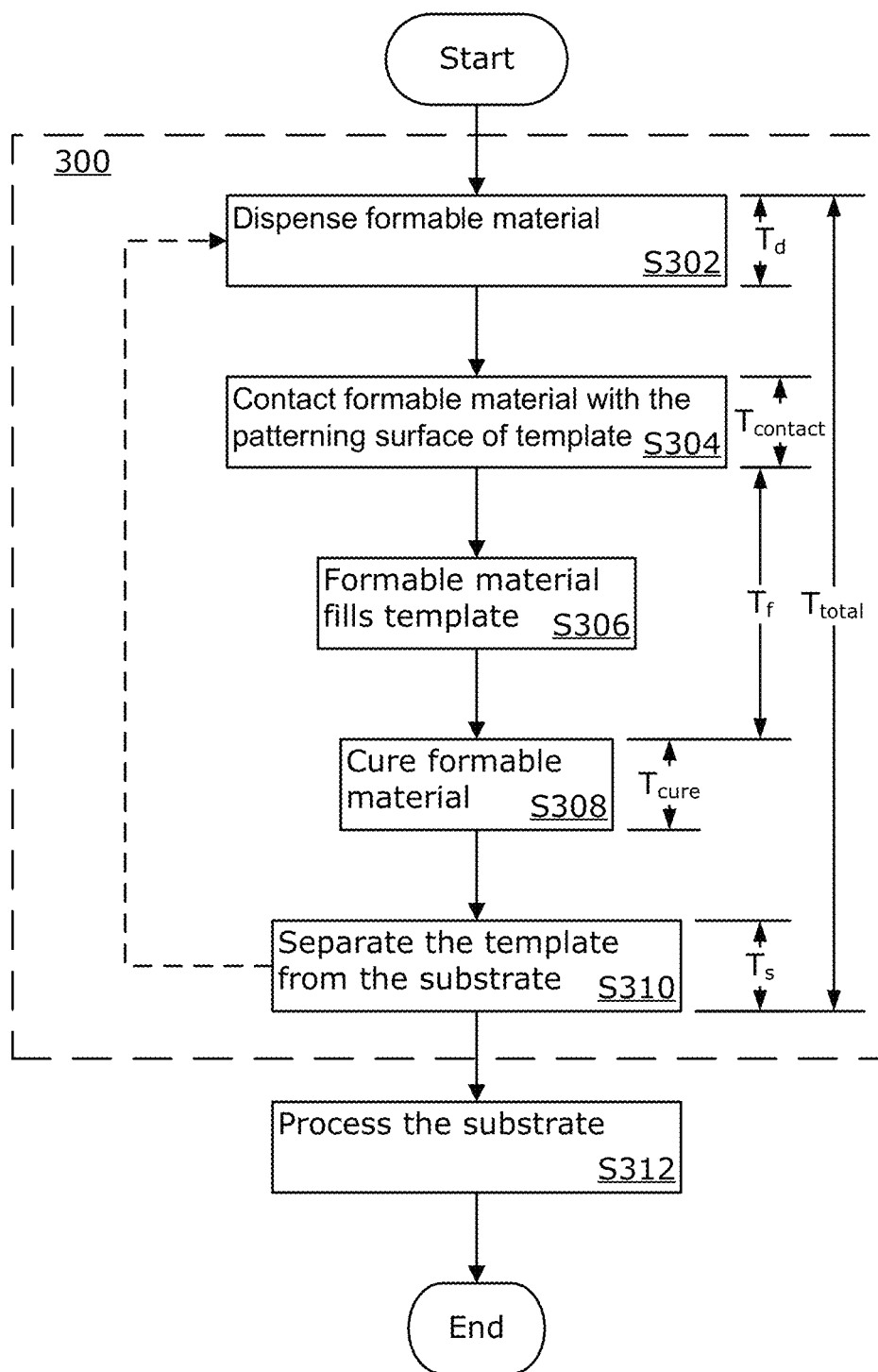
FIG. 3 is a flowchart illustrating an exemplary imprinting method as used in an embodiment.

FIG. 3 is a flowchart of a method of manufacturing an article (device) that includes a shaping process 300 performed by the shaping system 100. The shaping process 300 can be used to form patterns in formable material 124 on one or more imprint fields (also referred to as: pattern areas or shot areas). The shaping process 300 may be performed repeatedly on a plurality of substrates 102 by the shaping system 100. The processor 140 may be used to control the shaping process 300.

In an alternative embodiment, the shaping process 300 is used to planarize the substrate 102. In which case, the shaping surface 112 is featureless and may also be the same size or larger than the substrate 102.

The beginning of the shaping process 300 may include a template mounting step causing a template conveyance mechanism to mount a template 108 onto the template chuck 118. The shaping process 300 may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the shaping system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by a shaping field index i. In which N is the number of shaping fields and is a real positive integer such as 1, 10, 62, 75, 84, 100, etc. $\{N \in \mathbb{Z}^+\}$. In a dispensing step S302, the processor 140 may cause the fluid dispenser 122 to dispense formable material based on a drop pattern onto an imprinting field. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field may be moved relative to the fluid dispenser 122 while the fluid dispenser is ejecting formable material 124. Thus, the time at which some of the droplets land on the substrate may vary across the imprint field i. The dispensing step S302 may be performed during a dispensing period $T_d$ for each imprint field i.

In an embodiment, during the dispensing step S302, the formable material 124 is dispensed onto the substrate 102 in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in a particular imprint field. The contacting step S304 may be performed during a contacting period $T_{contact}$ which starts after the dispensing period $T_d$ and begins with the initial contact of the shaping surface 112 with the formable material 124. In an embodiment, at the beginning of the contact period $T_{contact}$ the template chuck 118 is configured to bow out the template 108 so that only a portion of the shaping surface 112 is in contact with a portion of the formable material. In an embodiment, the contact period $T_{contact}$ ends when the template 108 is no longer bowed out by the template chuck 118. The degree to which the shaping surface 112 is bowed out relative to the substrate surface 130 may be estimated with the spread camera 136. The spread camera 136 may be configured to record interference fringes due to reflectance from at least the shaping surface 112 and the substrate surface 130. The greater the distance between neighboring interference fringes, the larger the degree to which the shaping surface 112 is bowed out.

During a filling step S306, the formable material 124 spreads out towards the edge of the imprint field and the mesa sidewalls 246. The edge of the imprint field may be defined by the mesa sidewalls 246. How the formable material 124 spreads and fills the mesa may be observed via the field camera 136 and may be used to track a progress of a fluid front of formable material. In an embodiment, the filling step S306 occurs during a filling period $T_f$. The filling period $T_f$ begins when the contacting step S304 ends. The filling period $T_f$ ends with the start of a curing period $T_c$. In an embodiment, during the filling period $T_f$ the back pressure and the force applied to the template are held substantially constant. Substantially constant in the present context means that the back pressure variation and the force variation is within the control tolerances of the shaping system 100 which may be less 0.1% of the set point values.

In a curing step S308, the processor 140 may send instructions to the radiation source 126 to send a curing illumination pattern of actinic radiation through the template 108, the mesa 110, and the shaping surface 112 during a curing period $T_c$. The curing illumination pattern provides enough energy to cure (polymerize) the formable material 124 under the shaping surface 112. The curing period $T_c$ is a period in which the formable material under the template receives actinic radiation with an intensity that is high enough to solidify (cure) the formable material. In an alternative embodiment, the formable material 124 is exposed to a gelling illumination pattern of actinic radiation before the curing period $T_c$ which does not cure the formable material but does increase the viscosity of the formable material.

In a separation step S310, the processor 140 uses one or more of: the substrate chuck 104; the substrate positioning stage 106, template chuck 118, and the shaping head 120 to separate the shaping surface 112 of the template 108 from the cured formable material on the substrate 102 during a separation period $T_s$. If there are additional imprint fields to be imprinted, then the process moves back to step S302. In an alternative embodiment, during step S302 two or more imprint fields receive formable material 124 and the process moves back to steps S302 or S304.

In an embodiment, after the shaping process 300 is finished additional semiconductor manufacturing processing is performed on the substrate 102 in a processing step S312 so as to create an article of manufacture (e.g., semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, mounting, circuit board assembly, and the like. The substrate 102 may be processed to produce a plurality of articles (devices).

Template and Curing System

Figure 4A:
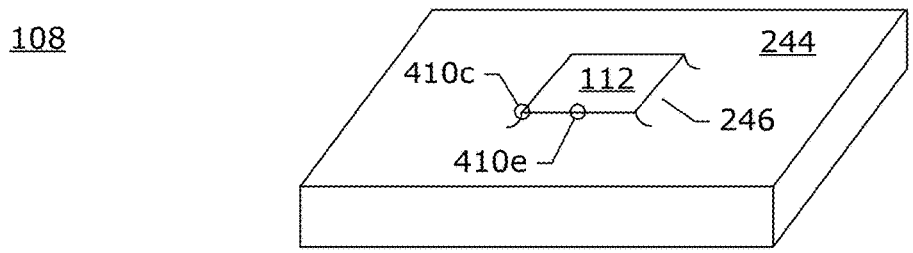
FIG. 4A is a perspective view of a front side of an exemplary template that may be used in an embodiment.

FIG. 4A is a perspective view of the front side of the template 108 showing the patterning surface 112 on the mesa 110. Mesa sidewalls 246 connect the patterning surface 112 to the recessed surface 244 of the template 108. A rectangular or square mesa 110 will have four mesa edges 410e and four mesa corners 410c (corners of the mesa) at the intersection of the patterning surface 112 and the mesa sidewalls 246. The mesa 110 is not necessarily square but may take on any shapes (circle, hexagon, etc.). The mesa sidewalls 246 may have some curvature where they intersect with the recessed surface 244 either by design or due to the method of fabrication. The mesa sidewalls may have a height between 10-100 μm.

Figure 4B:
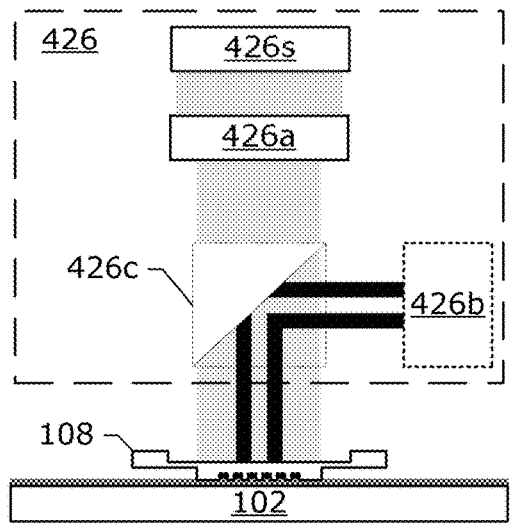
FIG. 4B is an illustration of arrangement of some components that may be used in an exemplary embodiment.

FIG. 4B is simplified diagram illustrating some components of the shaping system 100. A curing system 426 includes a radiation source 426s that supplies a beam of actinic radiation to an optical diaphragm 426a which may be used to control the spatial distribution of the beam of actinic radiation. The shaping system may include additional optical components which guide, shape, and/or homogenize the beam of actinic radiation. The optical diaphragm 426a may include a plurality of blades whose positions are adjustable. The applicant has found that it is helpful to use the blades to control the intensity of the beam of actinic radiation along the mesa edges 410e and mesa corners 410c of the mesa 110 of the template 108.

The curing system 426 may include a secondary curing system 426b which supplies additional actinic radiation which increases the viscosity, partially cures, and/or cures the formable material prior to the curing step S308 as described in US Patent Publication Nos. 2020/0223126 and 2019/0179228 both of which are hereby incorporated by reference. The additional actinic radiation supplied by the secondary curing system 426b may be combined with the actinic radiation from the radiation source 426s by a beam combiner 426c before or after the optical diaphragm 426a. The secondary curing system 426b may include a spatial light modulator (not shown) having a grid of pixels that allows the spatial distribution of the actinic radiation to be adjusted on a pixel by pixel basis.

Cure Quality

Figure 5A:
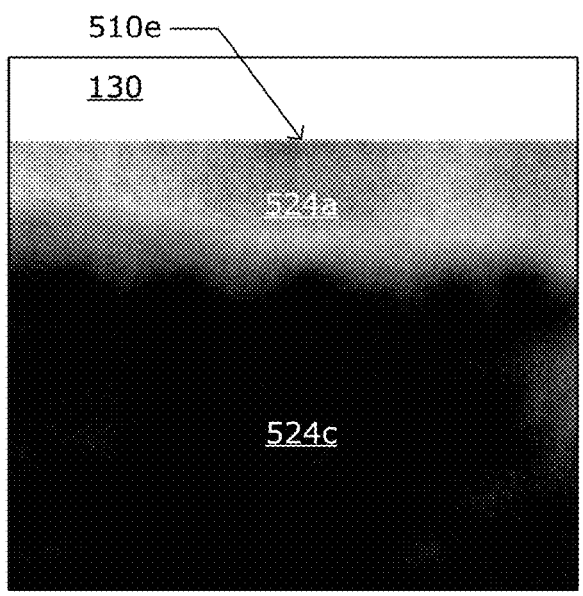
FIGS. 5A-B are micrographs of a cured film as produced by a nanoimprint lithography system.
Figure 5B:
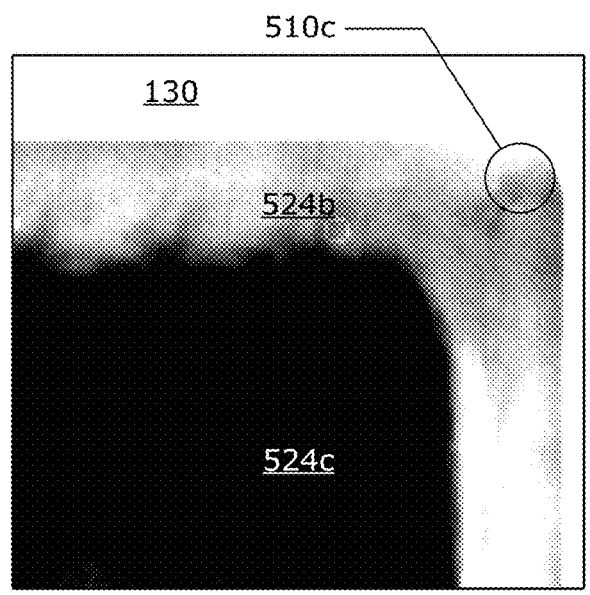

The quality of a cured film may be measured by obtaining micrographs of the cured film. FIGS. 5A-B are micrographs of a cured film 524 on a substrate surface 130 after the separation step S310 has been performed in different areas of the imprint field. The brightness and contrast of the micrographs in FIG. 5A have been adjusted to emphasize the difference in quality of cured film at the edges and corners of the cured film. The darker portions of the micrograph represent a higher quality cured film. The micrograph in FIG. 5A shows a high quality portion of a cured film 524a adjacent to an imprint field edge 510e represented by dark grey. The imprint field edge 510e of the cured film corresponds to the mesa edge 410e. The micrograph in FIG. 5B shows a poor quality portion of the cured film 524b adjacent to an imprint field corner 510c represented by light grey. The imprint field corner 510c of the cured film corresponds to the mesa corner 410c. The black portions of the micrographs represent the highest quality portion of the cured film 524c. These micrographs are of a cured film that was created with a shaping system 100 in which the secondary curing system 524c provides actinic radiation inset from the mesa sidewalls 246 and the optical diaphragm 246a sends actinic radiation that covers the entire imprint field with a reduced intensity at the mesa edges 410e. The applicant has found that this arrangement provides for a high quality cured film and reduces extrusion type defects in which formable material leaks out beyond the mesa edges 410e.

The variation in intensity found in the micrographs of the cured film are indicative of variations in properties of the cured film including but not limited to: thickness of the cured film; density of the cured film; and degree of polymerization of the cured film. The applicant has determined that this poor quality cured film corresponds to variation in the intensity of the actinic radiation provided at the mesa corners 410c relative to the intensity of the actinic radiation provided at the mesa edges 410e.

Figure 6A:
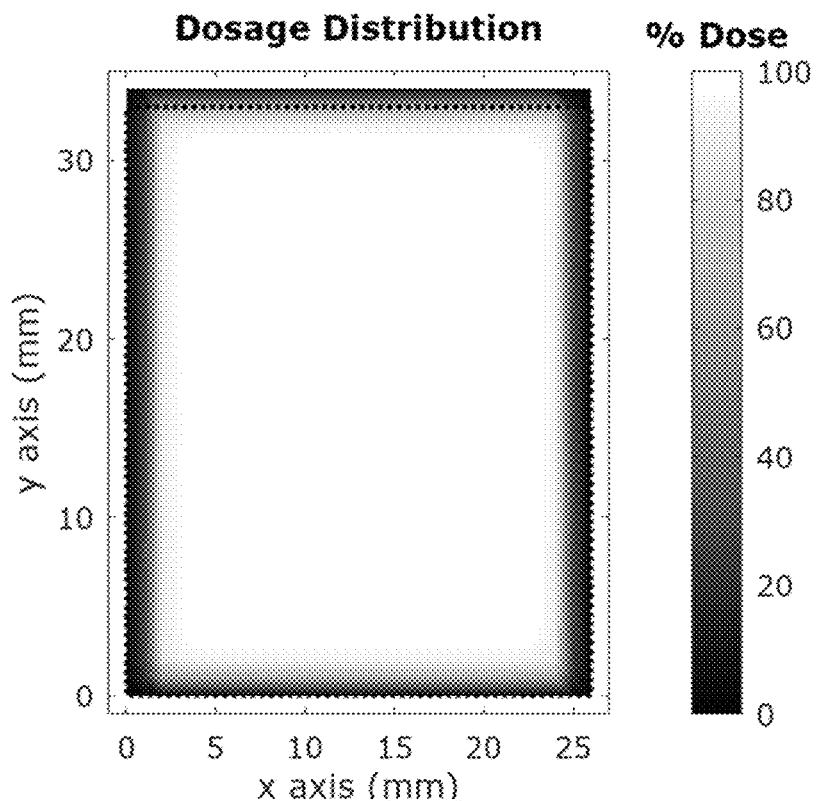
FIGS. 6A-H are charts illustrating the distribution of dosage of actinic radiation supplied by a nanoimprint lithography system.
Figure 6B:
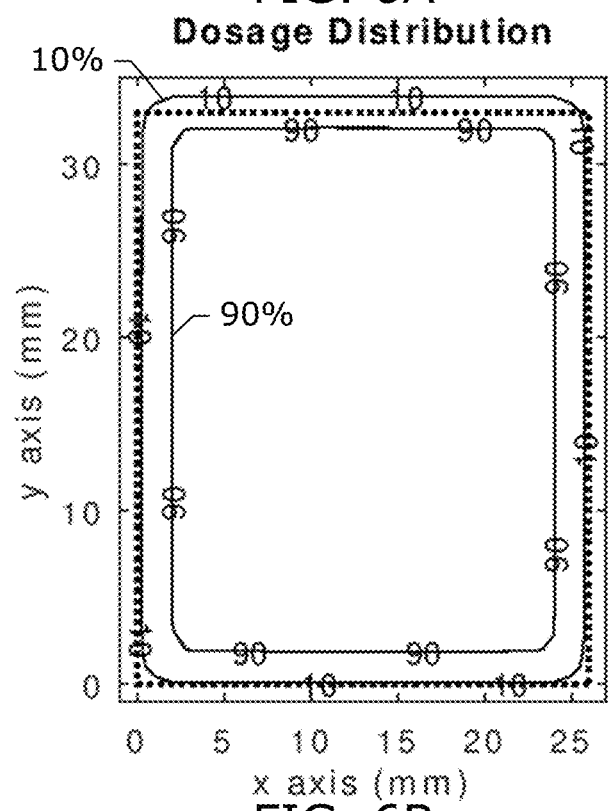

FIG. 6A is an illustration of a distribution of dosage of actinic radiation received by the formable material under the mesa in an imprint field. The edges of the imprint field (and corresponding edges of the mesa) are illustrated by a dark dotted line. FIG. 6B is a contour plot illustrating: 10% dosage contour line; 90% dosage contour line; and the imprint field edge (dotted line). Note the curvature of the contour lines at the corners. The distribution of the dosage of actinic radiation shown in FIGS. 6A-B was measured with blades of the optical diaphragm positioned near but not at a preferred position which supplies 10% of peak actinic radiation at the mesa edges 410e and a peak intensity in an interior portion of the imprint field.

Figure 6C:
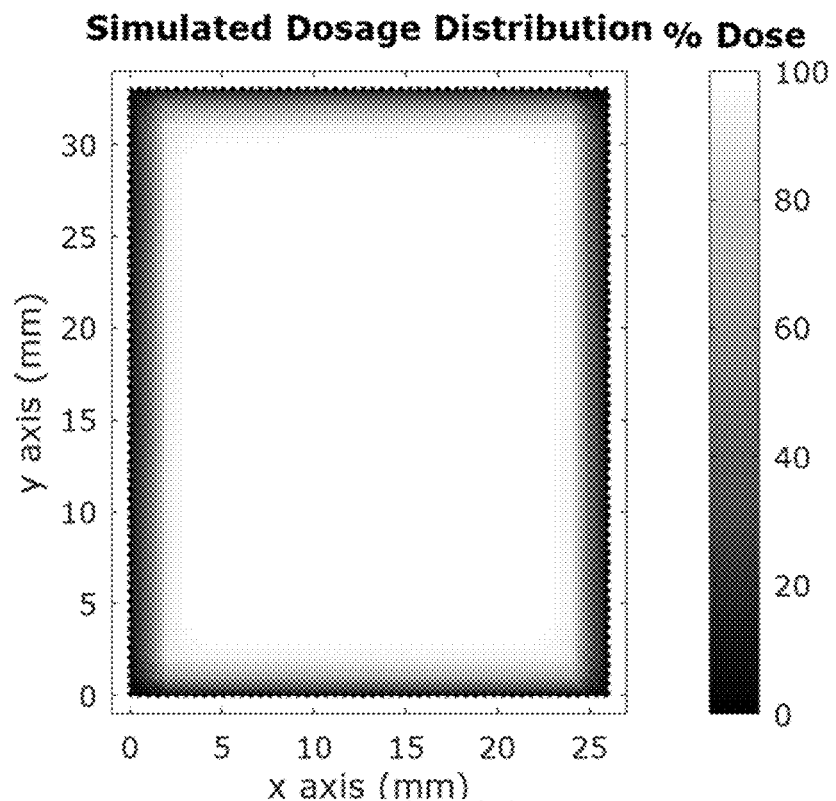
Figure 6D:
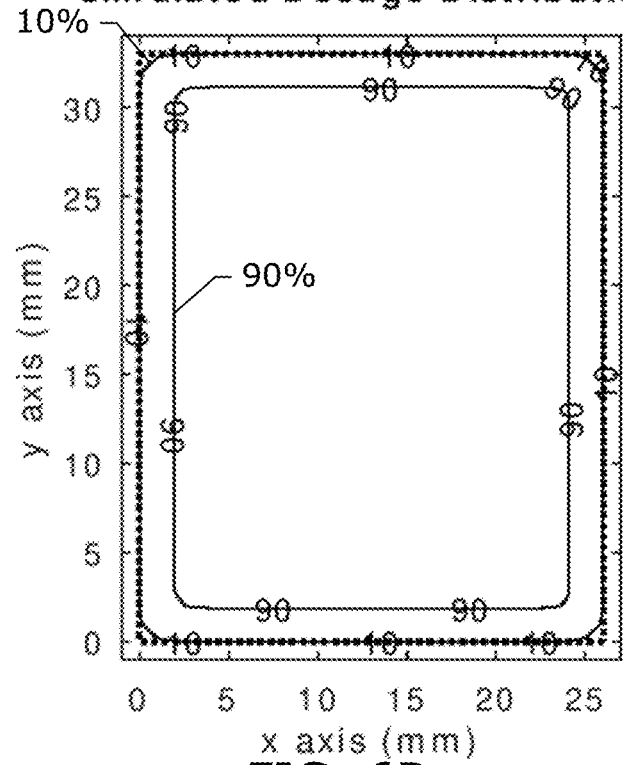
Figure 6E:
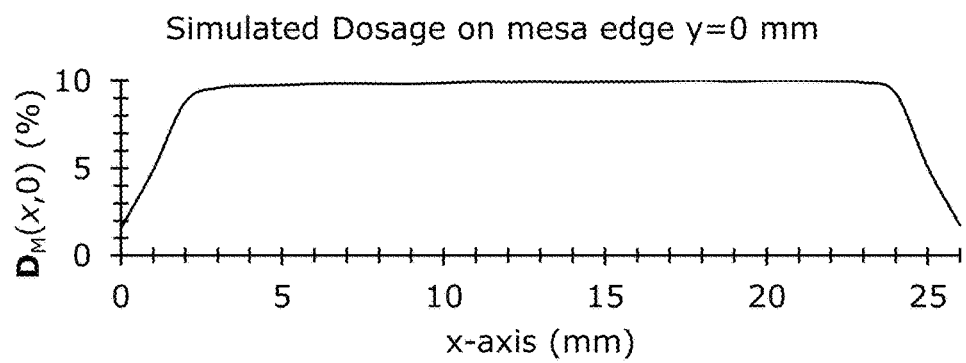
Figure 6F:
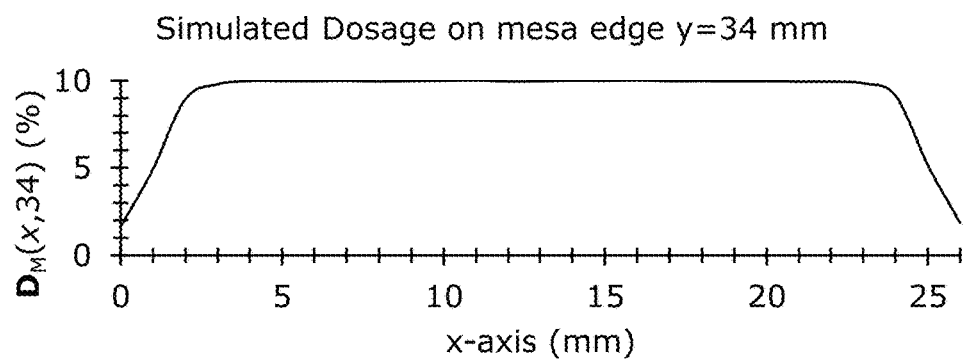
Figure 6G:
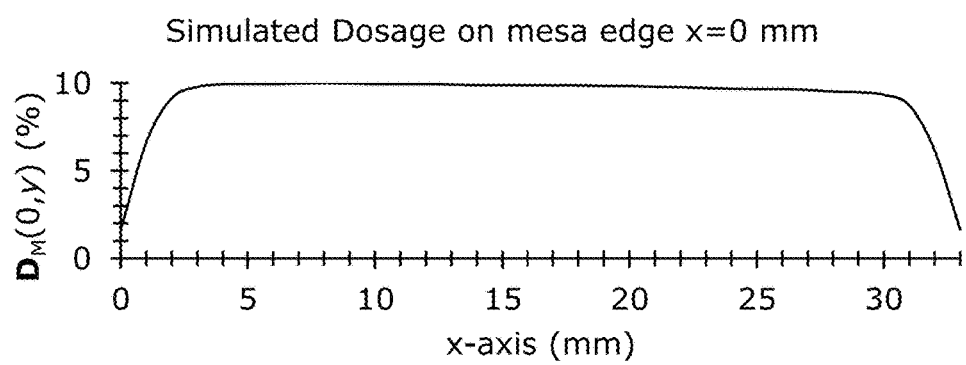
Figure 6H:
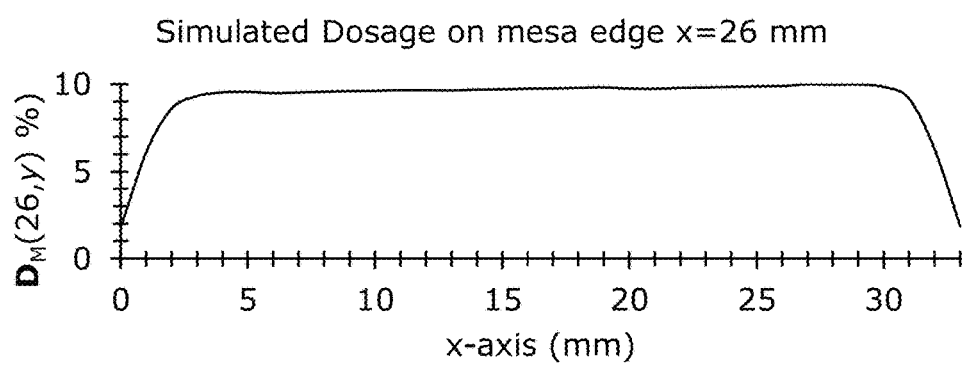

FIGS. 6C-E are simulated dosage distributions in which all of the blades are assumed to be at an exact position in which the peak intensity at each of the four mesa edges is 10% of a peak intensity in an interior portion of the imprint field. The simulated dosage distribution was generated using linear two dimensional interpolation to, align, shrink, and stretch the measured distribution of actinic radiation.

FIG. 6C is an illustration of the simulated distribution of dosage of actinic radiation received by the formable material under the mesa in an imprint field. The edges of the imprint field (and corresponding edges of the mesa) are illustrated by a dark dotted line. FIG. 6D is a contour plot illustrating: 10% simulated dosage contour line; 90% simulated dosage contour line; and the imprint field edge (dotted line). Note the curvature of the contour lines at the corners. FIGS. 6E-H are illustrations of the dosage along the mesa edges $D_m(x,y)$ 410e and the mesa corners 410c. Note how the dosage is reduced at the corners relative to the mesa edges 410e.

The applicant has found that there is preferred edge dosage ($D_E$) of actinic radiation at the mesa edges 410e that is less than the peak dosage ($D_r$) in the center of the imprint field ($D_E \leq D_P$) and is also a preferred fraction (F) of the peak dosage ($D_E = F^* D_P; F<1$). In an embodiment, the preferred fraction (F) is one of 10%, 20%, 30%, 40%, 50%, 60%, 70%, 80%, 90%, 95% or 99%. The preferred fraction (F) is determined experimentally based on minimizing defects such as: extrusion defects; non-fill defects; and poor cure quality defects.

Optical Diaphragm

To address these issues illustrated in FIGS. 6A-H, the optical diaphragm 726 includes blades 748 that are modified to provide additional actinic radiation to the mesa corners 410c. In an embodiment, the blades 748a-d have cutouts 752 which provides extra actinic radiation to reach the mesa corners 410c. Each blade has at least one cutout and preferably two cutouts in the edge each of the blades of the optical diaphragm. In an embodiment illustrated in FIG. 7A, the cutouts 752 have a rectilinear shape. The cutouts 752 may have other shapes which provide different distributions of actinic radiation to the mesa corners 410c. In an embodiment, the optical diaphragm 726 forms an aperture (opening) that has an approximate shape that is similar to the overall shape of the shaping surface 112. If the approximate shape of the shaping surface 112 is rectangular then the aperture 754 formed by the optical diaphragm is also rectangular. The edges of the blades 748 and the cutouts 752 in those edges of the blades 748 of the plurality of blades 748 form an opening 754 which actinic radiation from the radiation source 426s passes through to reach the formable material 124 under the mesa 246.

Figure 7A:
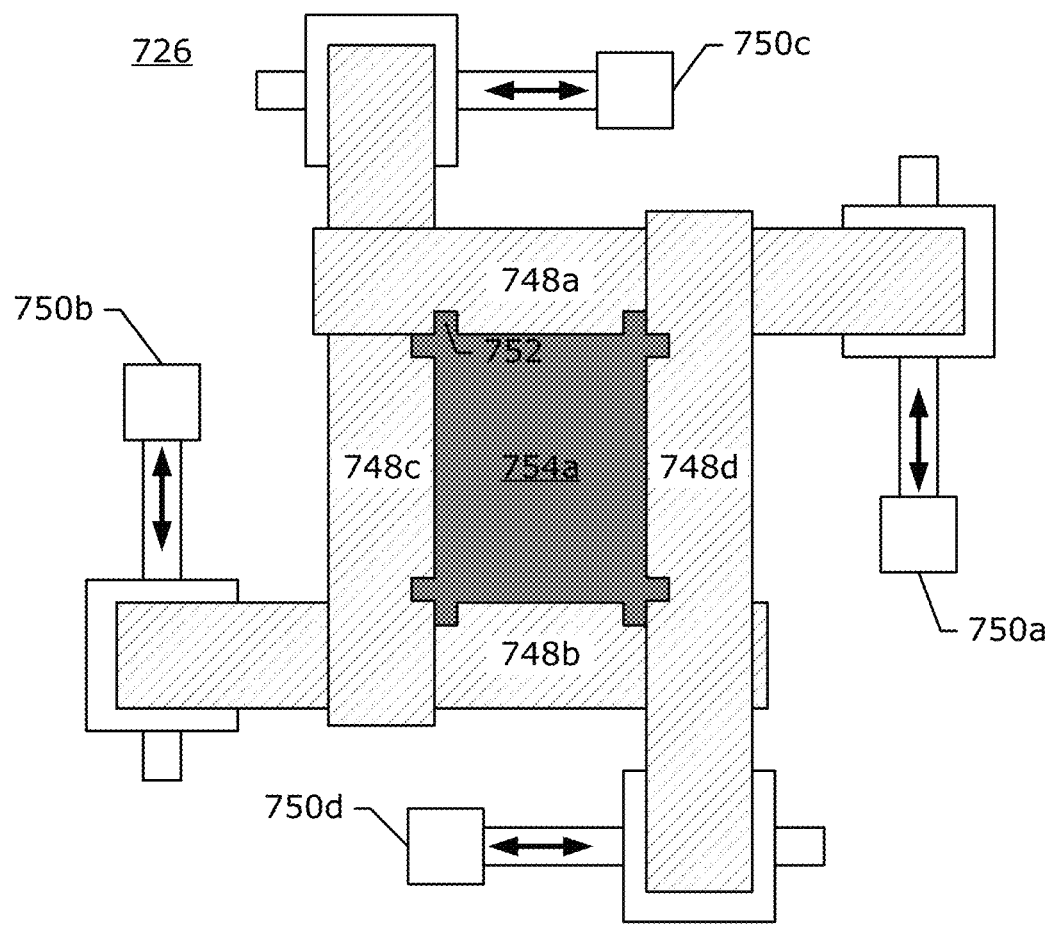
FIGS. 7A-C are illustrations of an exemplary optical diaphragm as may be used in an exemplary embodiment.

The blades 748 may be connected to one or motors 750a-d. Each motor 750 may be configured to move one blade back and forth on a track (not illustrated). In an alternative embodiment, a single motor may be used along with a transmission system to move multiple blades. FIG. 7A is an illustration of the blades 748 in a first position in which dosage at and near the corners is increased. A shape of the aperture 754a formed by the optical diaphragm 726 when the blades 748 are in the first position has an overall shape that is similar to the shape of the shaping surface 112 but does not match the shape of the shaping surface 112 and includes 8 ears corresponding to the shapes of the cutouts.

Figure 7B:
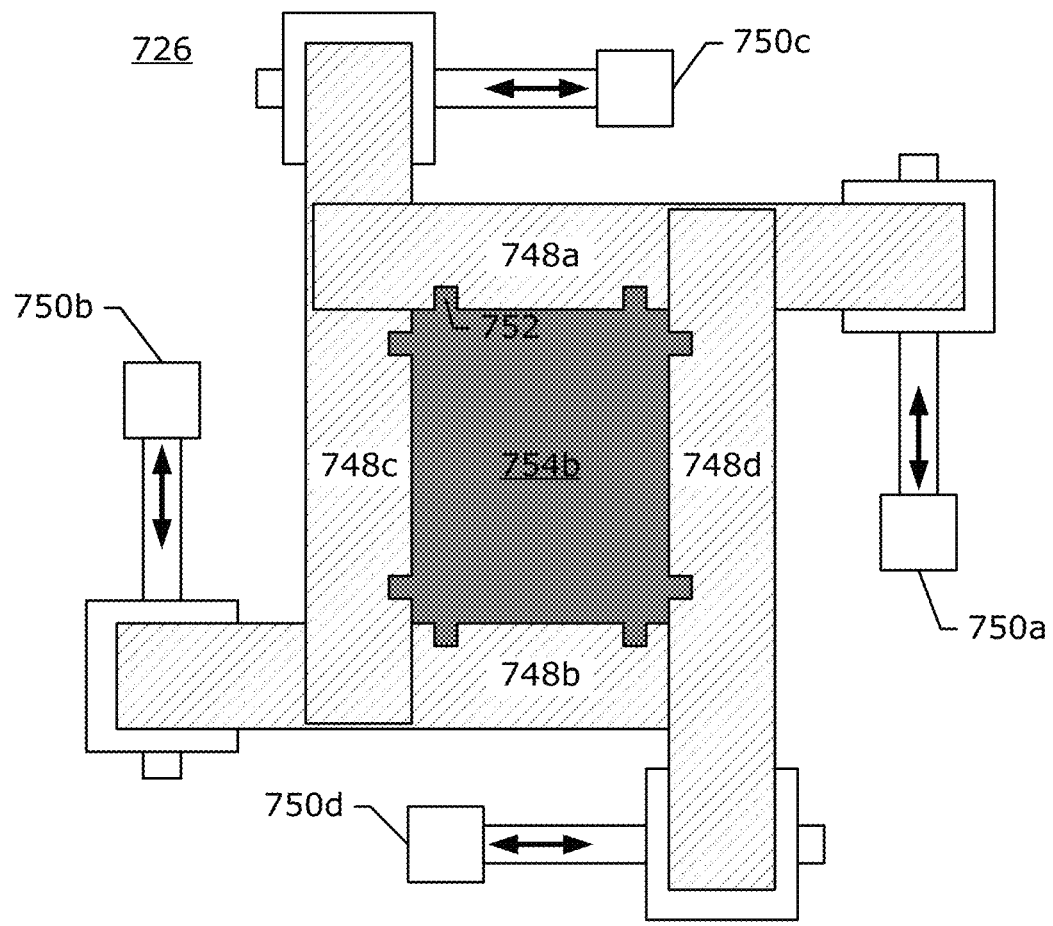

FIG. 7B is an illustration of the blades 748 in a second position in which the cutouts 752 are moved away from each other. A template 108 may include reflective and/or absorptive coatings on one or both of the recessed surface 244 and the mesa sidewalls 246. These coatings may be used in combination with the blades in the second position as illustrated in FIG. 7B to provide a uniform distribution of actinic radiation at the mesa corners 410c and the mesa edges 410e independent of the cutouts. When the blades 748 are in the second position then the overall shape of the aperture 754b as it overfills the area not blocked by the coatings on the template.

Figure 7C:
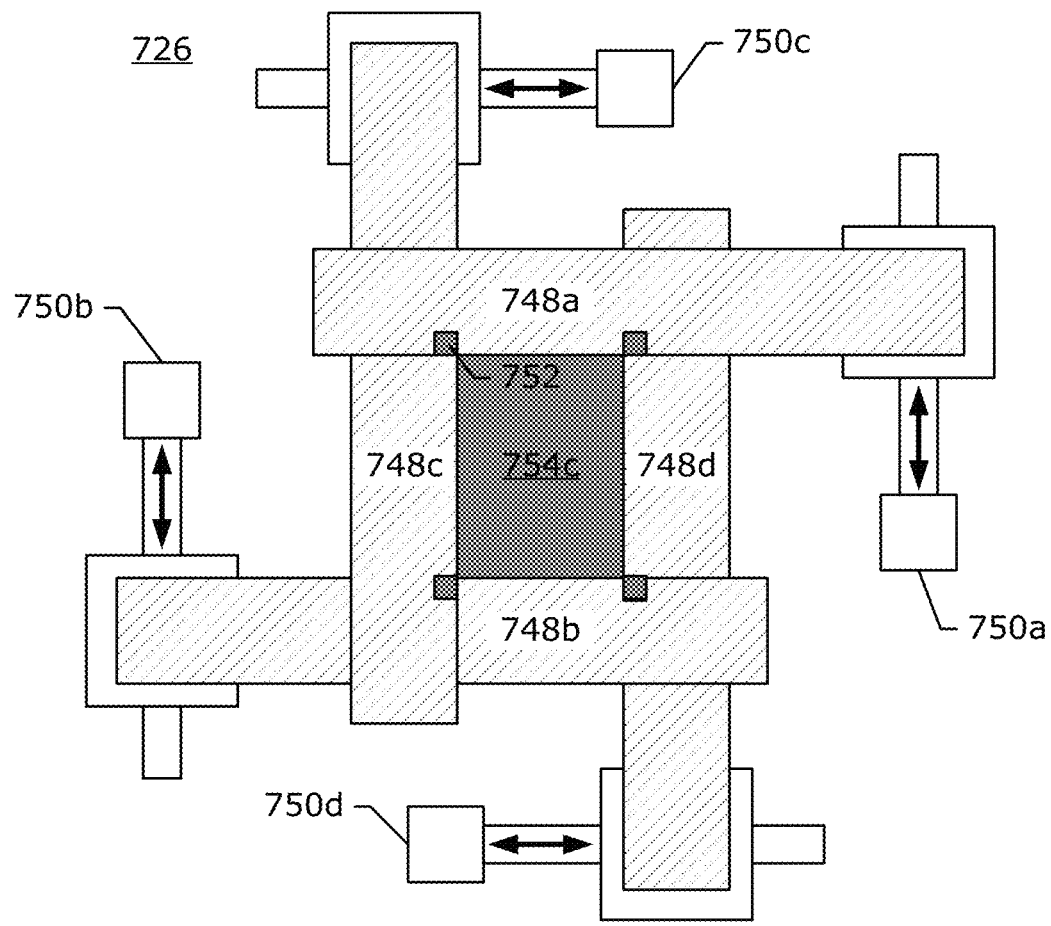

FIG. 7C is an illustration of the blades 748 in a third position in which the cutouts 752 overlap each other. This configuration allows extra actinic radiation to be supplied to the mesa corners 410c relative to the region adjacent to the mesa corners 410c. A shape of the aperture 754c formed by the optical diaphragm 726 when the blades 748 are in the third position has an overall shape that is similar to the shape of the shaping surface 112 but does not match the shape of the shaping surface 112 and includes 4 ears corresponding to the shapes of the cutouts 752 when the cutouts are overlapped.

Figure 8A:
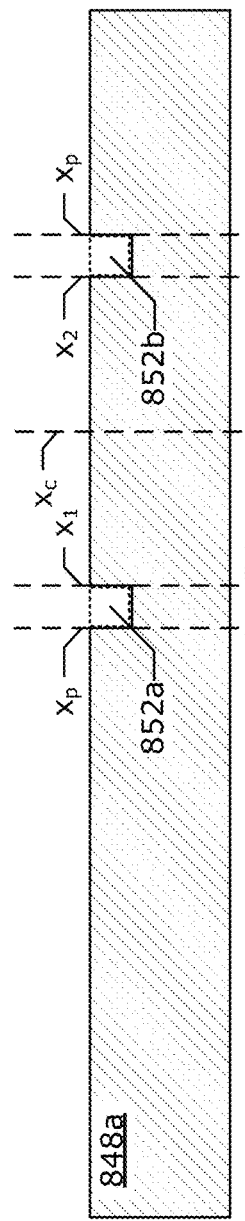
FIGS. 8A-E are illustrations of an exemplary optical diaphragm blades as may be used in an exemplary embodiment.

FIG. 8A is an illustration of an exemplary blade 848a with cutouts 852a-b positioned at specific points on the blade 848a. Each blade has a blade edge, the blades edge is that edge of the blade which forms the edge of the optical aperture 754. Each blade 848a has two perimeter points $x_p$ on the blade edge which are points at which one blade edge overlaps with another blade edge when forming the optical aperture 754a when the blades are in the first position. A central axis which bisects the optical aperture 754 will pass through a center point $x_c$ on the blade edge. The center point $x_c$ is located midway between the cutouts 852 and is also midway between the perimeter points $x_p$. The inner corner of each cutout may be located at inner the points $(x_1, x_2)$ on the blade edge.

Figure 8B:
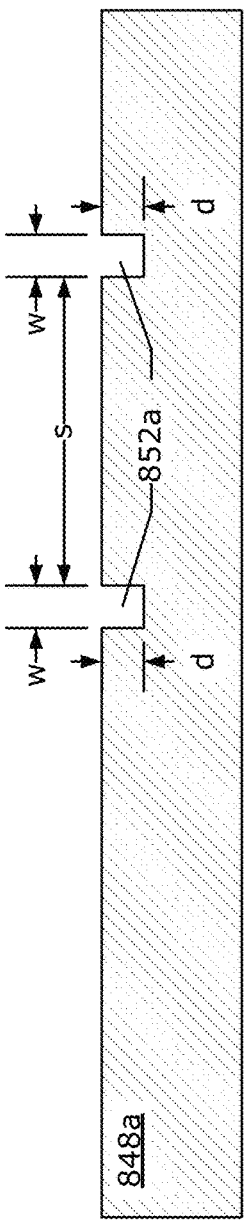
Figure 8C:
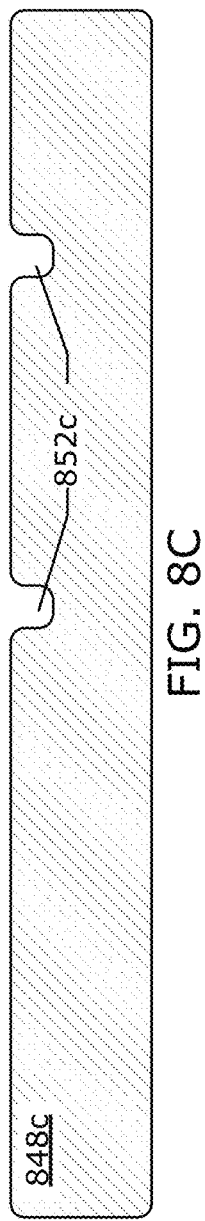
Figure 8D:
Figure 8E:
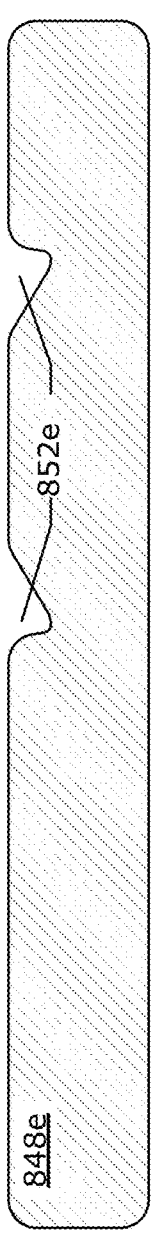

Key parameters for the cutouts are the cutout widths (w); cutout depths (d); and the cutout separation distance (s). These key parameters ensure the blades provide the desired actinic distribution. The applicant has determined that when the key parameters are d=w=3 mm and s=22 mm and 29 mm the blades with cutouts provide improved performance relative to blades without cutouts. These values may be determined experimentally and/or using simulations such as optical ray tracing. In an embodiment, the cutout width (w) is a cutout fraction ($f_c$) of cutout separation distance (s) ($f_c$=w/s). In which the cutout fraction ($f_c$) is between 0.1-0.2 and may be 0.13 or 0.10. In an embodiment, the shaping surface 112 and the mesa 110 are rectangular and therefore two different separation distances are required. Another important parameter is the shape of the cutouts. For example, in FIGS. 8A-B the cutouts 852a have a rectilinear shape; in FIG. 8C the cutouts 852c are rectilinear shape; in FIG. 8D the cutouts 852d have a triangular shape; and in FIG. 8E the cutouts 852e have a generally curved shape. In an embodiment, the blade edge has two cutouts that are symmetric relative to the center point $x_c$.

Figure 9:
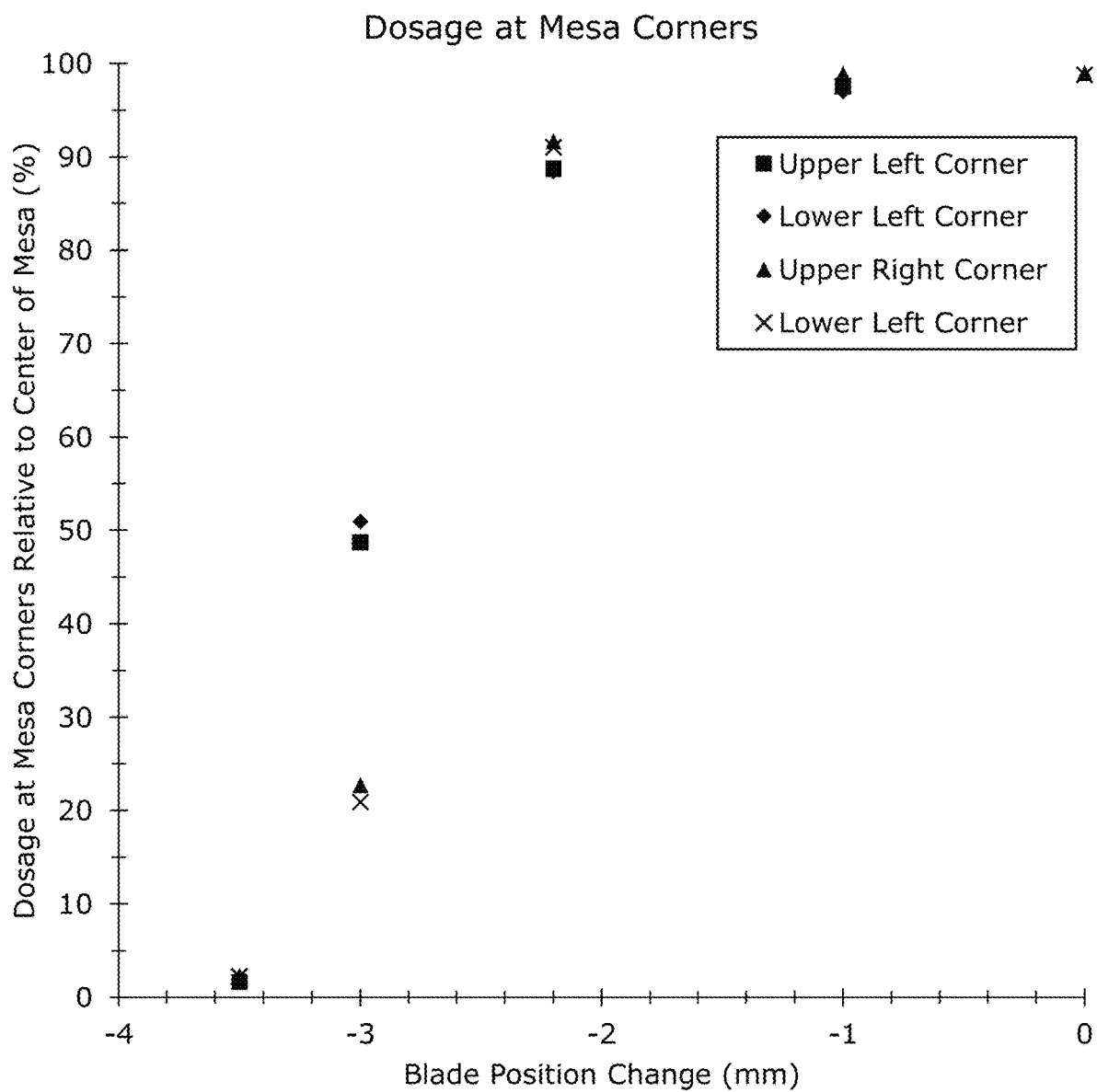
FIG. 9 is a chart illustrating the variation of dosage received the mesa corners based on changes in the blade positions.

Experimental methods of determining parameters of the cutouts may include measuring the spatial distribution of actinic energy supplied by the shaping system when the blades are at a plurality of positions. The spatial distribution of actinic energy may be measured by using a sensor at the plane of the formable material or by forming a plurality of test films and obtaining micrographs of the cured films. Once a plurality of spatial distributions are obtained then a range of positions for the blade edge may be obtained which provide good performance. For example, the dosage associated with the mesa corners 410c may be measured when a blade without cutouts (cutout-free blades) is positioned at a plurality of positions as illustrated in FIG. 9. An ideal shape of the blade would then pass through the range of positions.

The mesa edges 410e receive a mesa edge dosage $D_M(x,y)$ that varies across the mesa edges. In which the mesa edge dosage is a function or a set of values that has values only along the mesa edges and is undefined at other locations. The applicant has found that it is preferred that the range of $D_M(x,y)$ is useful metric that can predict the quality of the cured film and should be kept to a minimum and is preferred to be below a range threshold which is for example 5%, 4%, 3% 1% or 0.5%. The range of $D_M(x,y)$ is highly dependent on the optical system that guides the actinic radiation to the mesa edges. The range of $D_M(x,y)$ can be estimated using optical simulation tools or can be measured. Another metric that is a good predictor of the quality of the cured film is a mesa edge variation between $D_M$(mesa edge center) and $D_M$(mesa edge corner) (|$D_M$(mesa edge center)–$D_M$(mesa edge corner)|). This should be kept to a minimum value and is preferred to below a variation threshold which is for example 5%, 4%, 3% 1% or 0.5%.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A shaping system comprising:
   a radiation source;
   a template chuck configured to hold a template;
   an optical diaphragm positioned between the template chuck and the radiation source; and
   the optical diaphragm has a plurality of blades, each blade having a cutout in an edge of the each blade,
   wherein each blade has two cutouts with a cutout width that are separated from each other by a cutout separation distance;
   wherein a cutout fraction is a cutout width divided by cutout separation distance; and
   wherein the cutout fraction is between 0.1-0.2,
   wherein edges and cutouts of the plurality of blades form an opening which actinic radiation from the radiation source passes through.

2. The shaping system of claim 1, wherein the cutouts are arranged to increase intensity, at an image plane, of actinic radiation from the radiation source at corners of a mesa of the template, relative to blades without cutouts.

3. The shaping system of claim 1, wherein the cutouts are arranged to reduce a variation in actinic radiation received at corners of a mesa of the template relative to the actinic radiation received at centers of mesa edges to be below a variation threshold.

4. The shaping system of claim 1, wherein the cutouts curve outwards towards intersections of the blades.

5. The shaping system of claim 1, the plurality of blades are movable to a first position at which a first particular cutout in a first particular blade intersects with a second particular cutout in a second particular blade.

6. The shaping system of claim 1, wherein one or more of the cutouts have a rectilinear shape.

7. The shaping system of claim 1, wherein the cutouts are arranged to reduce a range in actinic radiation received at mesa edges of the template to be below a range threshold.

8. The shaping system of claim 1, further comprising:
   a substrate chuck configured to hold a substrate;
   a positioning system configured to bring a mesa of the template into contact with formable material on the substrate;
   wherein the radiation source exposes the formable material to actinic radiation that has passed through the opening formed by the optical diaphragm.

9. A method of shaping a film with a shaping system comprising:
   bringing a template into contact with formable material on a substrate;
   exposing the formable material to actinic radiation from a radiation source that has passed through an opening formed by an optical diaphragm;
   separating the template from the formable material,
   wherein the shaping system comprises:
      the radiation source;
      a template chuck configured to hold the template;
      an optical diaphragm positioned between the template chuck and the radiation source; and
      the optical diaphragm has a plurality of blades, each blade having a cutout in an edge of the each blade,
      wherein the optical diaphragm has a plurality of blades, each blade having a cutout in an edge of the each blade,
      wherein each blade has two cutouts with a cutout width that are separated from each other by a cutout separation distance;
      wherein a cutout fraction is a cutout width divided by cutout separation distance; and
      wherein the cutout fraction is between 0.1-0.2,
      wherein edges and cutouts of the plurality of blades form an opening which actinic radiation from the radiation source passes through;
   wherein edges and cutouts of the plurality of blades form the opening.

10. A method of manufacturing an article, further comprising:
    shaping a device-yielding film on a device-yielding substrate using the method of claim 9;
    processing the device-yielding substrate; and
    forming the article from the processed device-yielding substrate.

11. The method of shaping the film according to claim 9, wherein the plurality of blades includes a first blade and a second blade which are moved to intersect to form a first corner of the optical diaphragm;
    wherein the first blade includes a first cutout that is a first distance from the first corner; and
    wherein the second blade includes a second cutout that is the first distance from the first corner.

12. The method of shaping the film according to claim 11, wherein the first distance is less than a width of the cutouts.

13. The method of shaping the film according to claim 11, wherein the first cutout intersects with the second cutout.

* * * * *